(12) United States Patent
Zhou et al.

(10) Patent No.: US 7,837,821 B2
(45) Date of Patent: *Nov. 23, 2010

(54) LAMINATED MICROFLUIDIC STRUCTURES AND METHOD FOR MAKING

(75) Inventors: Peng Zhou, Newtown, PA (US); Lincoln C. Young, Ithaca, NY (US); Todd Roswech, Ithaca, NY (US)

(73) Assignee: Rheonix, Inc., Ithaca, NY (US)

( * ) Notice: Subject to any disclaimer, the term of this patent is extended or adjusted under 35 U.S.C. 154(b) by 322 days.

This patent is subject to a terminal disclaimer.

(21) Appl. No.: 12/033,958

(22) Filed: Feb. 20, 2008

(65) Prior Publication Data

US 2008/0178987 A1 Jul. 31, 2008

Related U.S. Application Data

(63) Continuation-in-part of application No. 10/964,216, filed on Oct. 13, 2004, now Pat. No. 7,608,160.

(51) Int. Cl.
*B32B 38/04* (2006.01)

(52) U.S. Cl. .............. 156/272.2; 156/272.8; 156/273.3; 156/273.7; 156/285; 422/102

(58) Field of Classification Search .................. 422/50, 422/68.1, 100, 102; 156/272.2, 273.3, 273.5, 156/273.7, 285, 305, 311, 349, 272.8
See application file for complete search history.

(56) References Cited

U.S. PATENT DOCUMENTS

| 4,335,218 A | 6/1982 | Deguiseppi |
| 5,731,212 A | 3/1998 | Gavin et al. |

(Continued)

FOREIGN PATENT DOCUMENTS

DE    19947495 A1    5/2001

(Continued)

OTHER PUBLICATIONS

Skowronski, Maik; Patent Cooperation Treaty PCT International Search Report; Jun. 20, 2007; European Patent Office.

(Continued)

*Primary Examiner*—Jill Warden
*Assistant Examiner*—Dwayne K Handy
(74) *Attorney, Agent, or Firm*—William Greener; Bond, Schoeneck & King, PLLC

(57) ABSTRACT

A method for making a polymeric microfluidic structure in which two or more components (layers) of the microfluidic structure are fixedly bonded or laminated with a weak solvent bonding agent, particularly acetonitrile or a mixture of acetonitrile and alcohol. In an aspect, acetonitrile can be used as a weak solvent bonding agent to enclose a microstructure fabricated in or on a non-elastomeric polymer such as polystyrene, polycarbonate, acrylic or other linear polymer to form a three-dimensional microfluidic network. The method involves the steps of wetting at least one of the opposing surfaces of the polymeric substrate components with the weak solvent bonding agent in a given, lower temperature range, adjacently contacting the opposing surfaces, and thermally activating the bonding agent at a higher temperature than the lower temperature range for a given period of time with RF or ultrasonic energy. The contacted polymeric substrates may also be aligned prior to thermal activation and compressed during thermal activation. A laminated, polymeric microfluidic structure is also disclosed.

24 Claims, 7 Drawing Sheets

U.S. PATENT DOCUMENTS

| | | |
|---|---|---|
| 5,858,188 A | 1/1999 | Soane et al. |
| 6,074,725 A | 6/2000 | Kennedy |
| 6,176,962 B1 | 1/2001 | Soane et al. |
| 6,395,124 B1 | 5/2002 | Oxman et al. |
| 6,509,085 B1 | 1/2003 | Kennedy |
| 6,555,067 B1 | 4/2003 | Gandhi et al. |
| 6,752,894 B2 | 6/2004 | Jing et al. |
| 6,777,170 B1 | 8/2004 | Bloomstein et al. |
| 7,608,160 B2 * | 10/2009 | Zhou et al. ............... 156/272.2 |
| 2002/0166585 A1 | 11/2002 | O'Connor |
| 2002/0182241 A1 | 12/2002 | Borenstein et al. |
| 2003/0129360 A1 | 7/2003 | Derand et al. |
| 2003/0150555 A1 | 8/2003 | Gandhi et al. |
| 2003/0156992 A1 | 8/2003 | Anderson et al. |
| 2003/0170880 A1 | 9/2003 | Goshoo et al. |
| 2004/0144647 A1 | 7/2004 | Dorner et al. |

FOREIGN PATENT DOCUMENTS

| | | |
|---|---|---|
| WO | 9956954 A1 | 11/1999 |
| WO | 2005114169 A | 12/2005 |

OTHER PUBLICATIONS

Skowronski, Maik; Patent Cooperation Treaty PCT Written Opinion of the International Searching Authority; Jun. 20, 2007; European Patent Office.

Supplemental European Search Report for Application No. 04795012.6-2109 completed Aug. 21, 2007.

"Development of a plastic microfluidics chip," www.devicelink.com/ivdt/archive/03/03/003.html.

"Acetonitrile Chemical Backgrounder," www.nsc.org/library/chemical/acetonit.htm.

* cited by examiner 2.5   3   3.5   4   4.5   5 μm

LAMINATED MICROFLUIDIC STRUCTURES AND METHOD FOR MAKING

CROSS-REFERENCE TO RELATED APPLICATIONS

This application is a continuation-in-part application filed under 37 CFR 1.53(b) of parent application U.S. Ser. No. 10/964,216 filed on Oct. 13, 2004, the subject matter of which is incorporated herein by reference in its entirety to the fullest allowable extent, and claims the benefit of and priority thereto.

STATEMENT REGARDING FEDERALLY SPONSORED RESEARCH OR DEVELOPMENT

Not applicable.

BACKGROUND OF THE INVENTION

1. Field of the Invention

Embodiments of the invention generally pertain to the field of microfluidics and, more particularly, to a laminated polymeric microfluidic structure and to a method for making a laminated polymeric microfluidic structure.

2. Description of Related Art

The technology of manipulating minute volumes of biological and chemical fluids is widely referred to as microfluidics. The realized and potential applications of microfluidics include disease diagnosis, life science research, biological and/or chemical sensor development, and others appreciated by those skilled in the art.

A microfluidic structure including a substrate having one or more microfluidic channels or pathways and a cover plate or a second or more substrates with fluid pathways that may or may not be interconnected, may commonly be referred to as a microfluidic chip. Highly integrated microfluidic chips are sometimes called 'labs on a chip'. Inorganic microfluidic chips having substrates made of glass, quartz or silicon have advantageous organic solvent compatibilities, high thermal and dimensional stability and excellent feature accuracy. These chips are typically fabricated using well-established microfabrication technologies developed for the semiconductor industry. However, the material and production costs of the inorganic chips may become prohibitively high especially when the fluidic pathway(s) requires significant area or the chip has to be disposable. In addition, many established biological assays were developed utilizing the surface properties of polymeric substrates. The research effort required to redevelop these assays on inorganic surfaces would require significant time and resource investments.

As an alternative to inorganic microfluidic structures such as those referred to immediately above, microfluidic structures or devices can also be made from polymeric materials. Polymeric microfluidic structures have advantageous low material costs and the potential for mass production. However, the fabrication of polymeric microfluidic chips presents a variety of challenges. For example, microfluidic chips may contain sealed microstructures. They can be formed by enclosing a substrate having a pre-fabricated fluid pathway or other microfeatures with a thin cover plate, or with one or more additional substrates to form a three-dimensional fluid network. The pathways or other microstructures have typical dimensions in the range of micrometers to millimeters. This multilayer microfluidic structure is integrated, or joined together, by various conventional techniques. These techniques include thermal, ultrasonic and solvent bonding. Unfortunately, these techniques often significantly alter the mated surfaces and yield distorted or completely blocked microfluidic pathways due, for example, to the low dimensional rigidity of polymeric materials under the aforementioned bonding conditions.

The use of adhesive lamination may circumvent some of these potential difficulties by avoiding the use of excessive thermal energy or a strong organic solvent. However, the introduction of an adhesive layer to a wall surface of an enclosed fluid pathway can cause other fabrication and/or application problems. Commercially available adhesives tend to be conforming materials with typical applied thicknesses of 12-100 micrometers. The compressive force required to produce a uniform seal between component layers will often extrude the adhesive into the fluid pathways resulting in microchannel dimensional alteration or obstruction. An additional potential problem with using adhesives is the formation of an adhesive wall within the enclosed microstructure. The presence of this dissimilar material makes uniform surface modification of the microstructure difficult. Furthermore, the manipulation or patterning of an adhesive layer is difficult, limiting the use of the adhesives to uniform continuous sheets or layers between two opposing planer surfaces. This restricts fluidic communication through a network to one planer surface, as the fluid cannot flow through the adhesive layer, preventing the use of a more versatile three-dimensional space.

The use of a strong organic solvent to join two or more discrete plastic parts is a well known practice in the art. In solvent welding, as this process is referred to, lamination solvents work by aggressively penetrating the macromolecular matrix of the polymeric component. This loosens the macromolecule-to-macromolecule bonds, uncoiling or releasing them from their polymer network to generate a softened surface. When two opposing softened surfaces are brought into close proximity, new macromolecular interactions are established. After the solvent evaporates there is a newly formed macromolecular network at the bonded interface with mechanical strength defined by the force of the macromolecular interaction. Exemplary strong organic solvents used for plastic lamination include ketones (acetone, methylethyl ketone or MEK), halogenated hydrocarbons (dichloromethane, chloroform, 1,2-dichloroethane), ether (tetrahydrofurane or THF) or aromatic molecules (xylene, toluene) and others known by those skilled in the art.

The use of the aforementioned strong solvents for bonding microfluidic chips with substrates composed of polystyrene, polycarbonate or acrylic is problematic. All of the solvents known to be used in the field of solvent bonding are "strong" (as defined by their ability to dissolve the polymeric substrate ) organic solvents. That is, these solvents tend to over-soften or dissolve the surface of the substrates during the bonding process. This may damage the microfluidic structure by completely erasing, blocking or destroying the fluid pathways when the substrates are laminated. Acetone, dichloromethane or xylene, for example, begin to dissolve a polystyrene sheet within seconds of application at room temperature. Although it is possible to weaken the solvent strength by mixing the solvent with "inert" solvents such as methanol or ethanol, the resulting bond often does not provide a satisfactory result.

The contemporary patent literature discloses using thermal bonding, thermal-melting adhesive, liquid curable adhesive, and elastomeric adhesive approaches to enclose two opposing microfluidic structure surfaces of the same or different materials. It is suggested that these methods are applicable to the fabrication of microchannels of various shapes and dimensions. It is apparent, however, that these approaches rely on stringent control of the fabrication and process conditions, which may result in unacceptable fabrication throughput and production yield.

Another reported technique suggests that the quality of a thermally laminated polymeric microchannel can be drastically improved if the opposing substrates have different glass transition temperatures. While this approach may provide a way to retain microstructural integrity during thermal bonding, the success rate will rely on precise process control. Consequently, its application to microfluidic chip manufacturing is restricted.

A recent publication describes a method of creating a plurality of relief structures along the length of a microfluidic channel wall, projecting from the opposing surface in the non-functional area of the substrate. Subsequent deposition of a bonding material fills this relief structure, completing the bond. This method allegedly can increase the manufacturing yield of adhesive bonded microfluidic devices. The significant challenge of dispensing the correct volume of bonding material into the relief structures is not addressed. The necessary control of the small volume of bonding material does not lend itself to high production yields.

In view of the foregoing, the inventors have recognized that a simple, reproducible, high yield method for enclosing polymeric microstructures is needed. Such a method would be particularly valuable for the fabrication of microfluidic chips from polystyrene, which is the most widely used material for biochemical, cellular and biological assays, acrylics and polymeric materials. It would also be desirable to have a method for microfluidic chip fabrication that is amenable to both laboratory use and manufacturing environments. Such a method would further be useful if it were applicable to the production of prototype devices, as well as being substantially directly transferable to large-scale production. Microfluidic structures made according to the envisioned methods would also be desirable for their economy and ease of production. Accordingly, embodiments of the invention are directed to microfluidic structures and fabrication methods that address the recognized shortcomings of the current state of technology, and which provide further benefits and advantages as those persons skilled in the art will appreciate.

SUMMARY OF THE INVENTION

An embodiment of the invention is generally directed to a method for making a polymeric microfluidic structure in which two or more components (layers) of the microfluidic structure are fixedly bonded or laminated with a weak organic solvent acting as a bonding agent. In a specific aspect, the weak solvent bonding agent is acetonitrile ($CH_3CN$, CAS No. 75-05-8). According to an aspect of the embodiment, acetonitrile can be used as a weak solvent bonding agent to enclose a microstructure fabricated in or on a non-elastomeric polymer such as polystyrene, polycarbonate, acrylic or other linear polymer to form a three-dimensional microfluidic network. According to an aspect, the method involves the steps of wetting at least one of the opposing surfaces of the polymeric substrate components with the weak solvent bonding agent in a given, lower temperature range, adjacently contacting the opposing surfaces, and thermally activating the bonding agent at a higher temperature than the lower temperature range for a given period of time, wherein thermal activating includes at least one of applying radio frequency energy and ultrasonic energy. In an exemplary aspect, the lower temperature range is between about minus 10 to positive 30° C., and more usually between about 0 to +24° C. The lower temperature range typically includes what is referred to herein as room temperature. The higher temperature is above about +20° C. and may typically be in the range between about 25 to 45° C. In an aspect, pressure is applied to the adjacently contacted components to assist the laminating process. It will be appreciated that the higher temperature necessary for thermally activating the weak solvent bonding agent may depend on the lamination process and the applied pressure. The applied pressure may usually be up to about 10 psi. More particularly, the applied pressure may be up to about 5 psi. In an aspect, an applied pressure range is up to about 2.5 psi. Alternatively, the mass alone of the substrate may provide sufficient bonding force, or a vacuum may be pulled that is sufficient to bring the surfaces into uniform contact. Illustrative compression time of the lamination process may range between about a few seconds when a roll laminator is used, to about a few minutes when using a heated platen press, for example.

According to another aspect, the method is directed to producing a multi-layer microfluidic structure by repetitively applying a weak solvent bonding agent to opposing surfaces of multiple (n) substrate components that may include one or more microstructures. In an aspect, the multiple substrate components can be slidingly aligned after the selected surfaces are wetted and opposing surfaces are in adjacent contact, prior to thermally activating the bonding agent. According to another aspect, the alignment can be carried out by vertically aligning and connecting discrete microstructures embedded at different substrate levels via vertically positioned through-holes in the substrate components.

According to another aspect, a polymeric, microstructural patterned substrate can be enclosed with a polymeric thin film bonded thereto with a weak solvent bonding agent that is thermally activated after the thin film is contacted with the substrate surface. According to this aspect, a contact surface of the substrate or the thin film can be wetted with the weak solvent bonding agent prior to contact. Alternatively, the surfaces can be adjacently contacted and the weak solvent bonding agent applied to an exposed edge whence it is wicked between the surfaces. The structure can then be exposed to thermal activation heat and a compressing source such as a roll laminator for the bonding agent activation and bond formation. This method provides one aspect for the realization of large scale microfluidic chip production. In alternative aspects, the weak solvent may be applied via vapor phase or gas phase condensation processes known in the art. Rather than cooling the solvent, the substrate may be cooled prior to solvent application.

Another embodiment of the invention is directed to a laminated, polymeric microfluidic structure. In an aspect, the laminated microfluidic structure includes a first component having first and second surfaces and one or more microstructures, and a second, polymeric component having first and second surfaces, in which the second component is fixedly attached to the first component by a weak solvent bonding agent. In a particular aspect, the weak solvent bonding agent is acetonitrile. In various aspects, the second surface may be a polymeric thin film that encloses the microstructures on the first component. Alternatively, the laminated structure may include a plurality (n) of polymeric substrate components each having one or more microstructures that may or may not be interconnected. The components' surfaces may be planar and parallel, planar and non-parallel, or non-planar including conforming curvatures or other undulations.

The foregoing and other objects, features, and advantages of embodiments of the present invention will be apparent from the following detailed description of the preferred embodiments, which make reference to the several drawing figures.

DETAILED DESCRIPTION OF PREFERRED EMBODIMENTS OF THE INVENTION

Figure 1A:
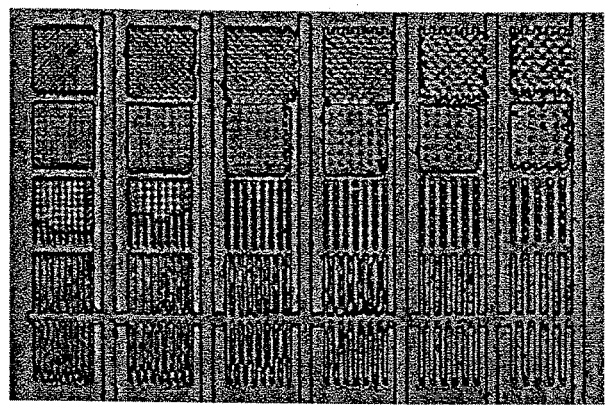
FIGS. 1A, 1B and 1C are reproduced images of a substrate component including microstructures prior to and subsequent to exposure to a weak solvent bonding agent according to an aspect of the invention.

As used herein, the word "microstructure" generally refers to structural features on a microfluidic substrate component with walls having at least one dimension in the range of about 0.1 micrometer to about 1000 micrometers. These features may be, but are not limited to, microchannels, microfluidic pathways, microreservoirs, microvalves or microfilters. The term "polymeric" refers to a macromolecular structure or material having a molecular weight that is substantially higher than the constituent monomers and, which is produced by a polymerization reaction. All materials commonly and herein referred to as "plastic" materials are polymeric materials. The term "acrylic" refers to Acrylite®, Plexiglas®, PMMA or other trade names of polymethylmethacrylate. A "two-dimensional microfluidic network" refers to fluidic connectivity of at least two microfluidic pathways or channels that co-exist within a component or in the plane of a planar component. A "three-dimensional microfluidic network" refers to fluidic connectivity of at least three microfluidic pathways or channels arranged in such a way that at least one of the three channels is out of the plane of the component or in another, non-planer component. The term of "weak solvent" as used herein refers to an organic solvent capable of forming a chemically bonded interface between two mating surfaces under appropriate temperature and force (i.e., due to pressure, vacuum and/or mass) conditions but having little or substantially no bonding effect otherwise. The term "inert solvent" refers to a solvent that is miscible with the weak solvent but having no bonding capability alone.

Embodiments of the invention are based on the surprising discovery by the inventors that when a weak solvent bonding agent is used as a lamination solvent to join non-elastomeric polymers such as polystyrene, polycarbonate, acrylic or other linear polymers under mild conditions, microstructures disposed on the substrate are not adversely affected. This discovery enables practical and economical fabrication of prototype as well as production fabrication of laminated, polymeric microfluidic structures.

According to an aspect, the weak solvent bonding agent may be chemically defined as:

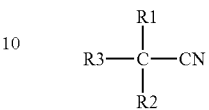

where, R1=H or R, where R=alkyl or is absent, R2=H or R, where R=alkyl or is absent, and R3=H or R, where R=alkyl or is absent.

Alternatively, the weak solvent may have a chemical formula of:

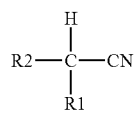

where, R1=H or R, where R=alkyl or is absent and R2=H or R, where R=alkyl or is absent.

Alternatively, the weak solvent may have a chemical formula of:

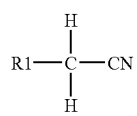

where, R1=H or R, where R=alkyl or is absent.

In a particular aspect, the weak solvent bonding agent is acetonitrile. Acetonitrile is a versatile solvent that is widely used in analytical chemistry and other applications. It is 100% miscible with water and exhibits excellent optical properties. Acetonitrile has a favorable dielectric constant, solubility parameters and low hydrogen bonding ability, which make it a useful solvent for protein and DNA sequencing. Acetonitrile, however, is not typically a solvent of choice for organic synthesis due to its limited solubility to many organic molecules. In fact, compared to many ketones, halogenated hydrocarbons, ether or aromatic molecules, acetonitrile has very limited ability to swell polymeric materials. As such, acetonitrile is referred to herein as a weak solvent. Since it is used as a bonding agent in the various embodiments of the invention described in detail below, it represents an exemplary weak solvent bonding agent for laminating polymeric microfluidic structures. Thus the weak ability of acetonitrile to dissolve a plastic surface makes it highly suitable for laminating polymeric materials such as polystyrene, polycarbonate, acrylic and other linear polymers. For example, microstructures disposed on a polystyrene substrate that was treated with acetonitrile at room temperature for at least several minutes did not exhibit any noticeable feature damage. Acrylic and polycarbonate have been observed to be more susceptible than polystyrene to acetonitrile, but this increased susceptibility can be controlled by applying the acetonitrile at a lower temperature or, alternatively, by using a combination of acetonitrile and other inert solvents.

Figure 1B:
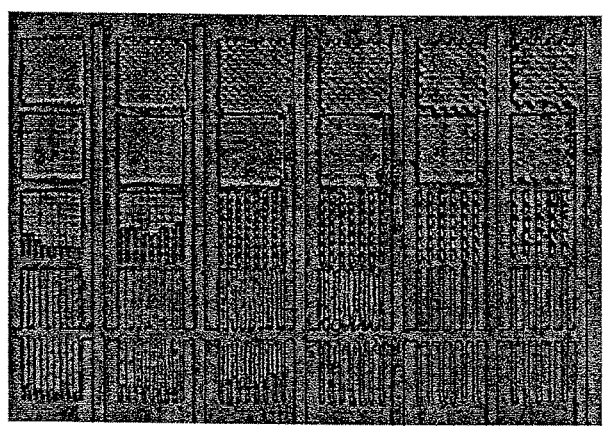
Figure 1C:
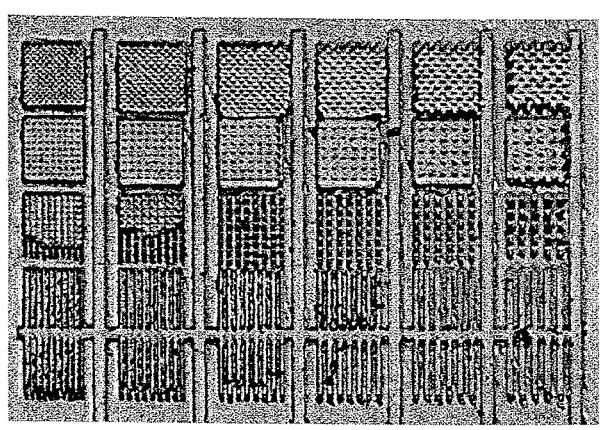

FIG. 1 illustrates the physical stability of a polystyrene substrate and associated microstructures that was exposed to acetonitrile. Test microstructures 100 ranging from about 2.5 to 5 μm in size, and approximately 10 μm in depth were replicated on 1 mm thick polystyrene sheets 110. FIG. 1A shows an image of the test microstructures 100 prior to the acetonitrile exposure. FIG. 1B shows an image of the test microstructures 100 covered with the acetonitrile. FIG. 1C shows an image of the test microstructures 100 after exposure to the acetonitrile at room temperature for 5 minutes. There is no sign that acetonitrile treatment at room temperature caused any noticeable surface deterioration of the test microstructures.

An apparently unique feature of acetonitrile lamination is that this weak solvent has remarkably different solubility strengths at different temperatures when used in relation to polymeric components of microfluidic structures according to embodiments of the invention. Although it is well known that the solubility of most inorganic or organic substances increases as the temperature of the applied solvent rises, utilizing this solubility variation at different temperature for controlled microfluidic structure solvent lamination requires a fine operating window. The substrate must be able to withstand solvent treatment at room temperature while increasing its solubility sufficiently at elevated temperature and pressure. Acetonitrile used as a laminated microfluidic structure bonding agent provides the required operating range in contrast to all currently known strong organic solvents that are generally used for solvent lamination.

Figure 2:
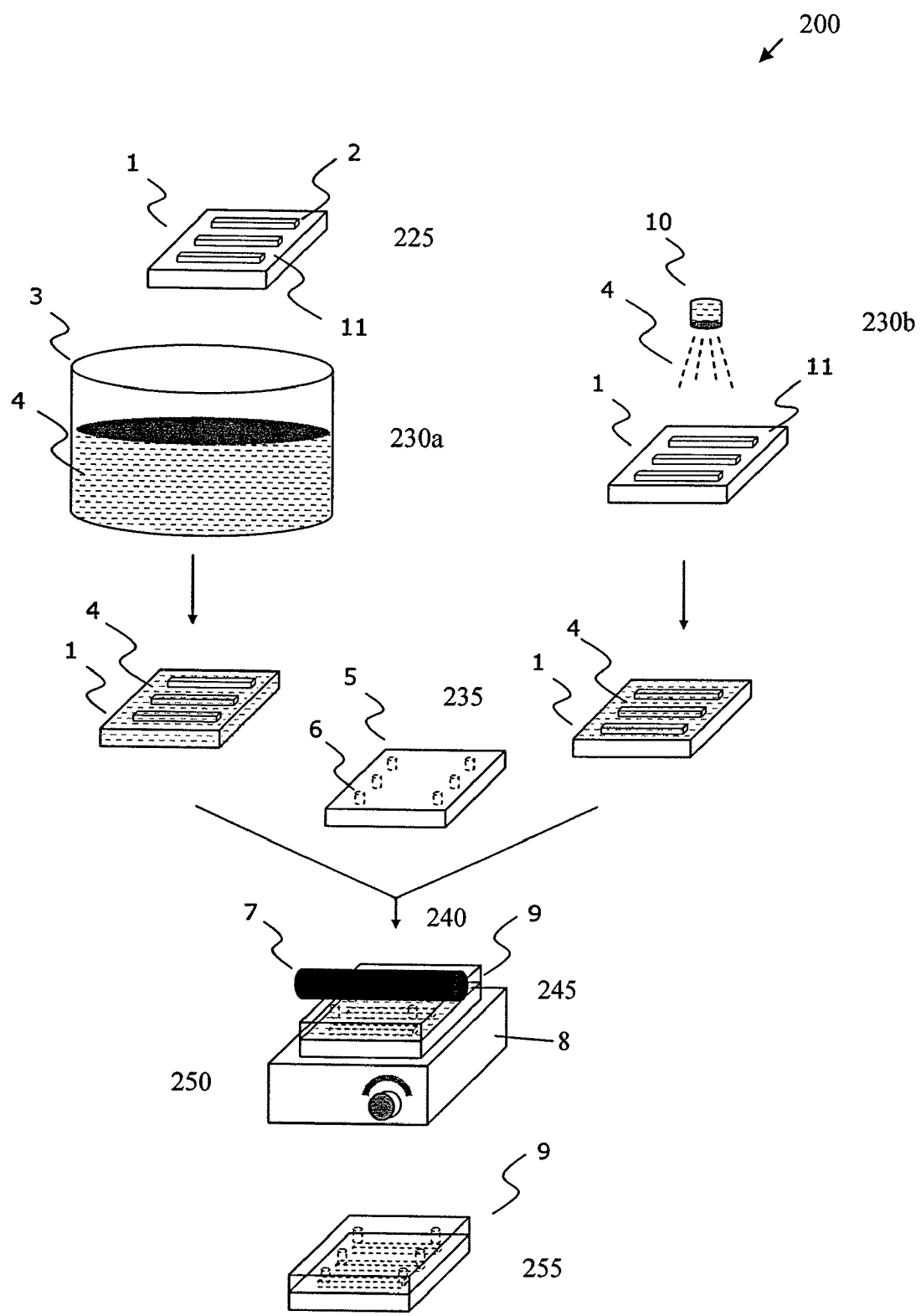
FIG. 2 is a schematic diagram illustrating a fabrication process for a laminated, polymeric microfluidic structure according to an embodiment of the invention.

An embodiment of the invention is directed to a method for making a laminated, polymeric microfluidic structure. FIG. 2 illustrates an exemplary two-step acetonitrile-based weak solvent bonding agent lamination process 200 used to fabricate a polystyrene microfluidic structure 9. An exemplary first component 1 comprising a polystyrene planer base plate that includes 1 to n microstructures 2 is provided at step 225. An intended contact surface 11 of the base plate 1 was wetted with acetonitrile at step 230a by dipping the component into a solvent container 3 containing acetonitrile 4 at room temperature. Alternatively, as shown at step 230b, the acetonitrile 4 can be sprayed via a nozzle 10 onto the intended contact surface 11 of the base plate 1 at room temperature. A second component 5, shown as a cover plate containing fluid communication through-holes 6, is provided at step 235. The cover plate was adjacently contacted with the surface 11 of the first component 1 at step 240. The microstructures 2 and the through-holes 6 can be aligned by sliding the cover plate in relation to the base plate or vice-versa to initially form the assembly 9 shown at 245. At step 250, the assembly 9 is placed atop a hot plate 8 at 24-45° C. to thermally activate the acetonitrile while being compressed by a roller 7. The bonding process was completed in about 1 minute for a polymeric sheet of 1 mm thickness to yield a finished, laminated microfluidic chip structure 9 shown at 255. The bonding quality and yield may be improved upon if a temperature-controlled press or a roll laminator is used in place of the hot plate 8 and the roller 7.

Figure 3:
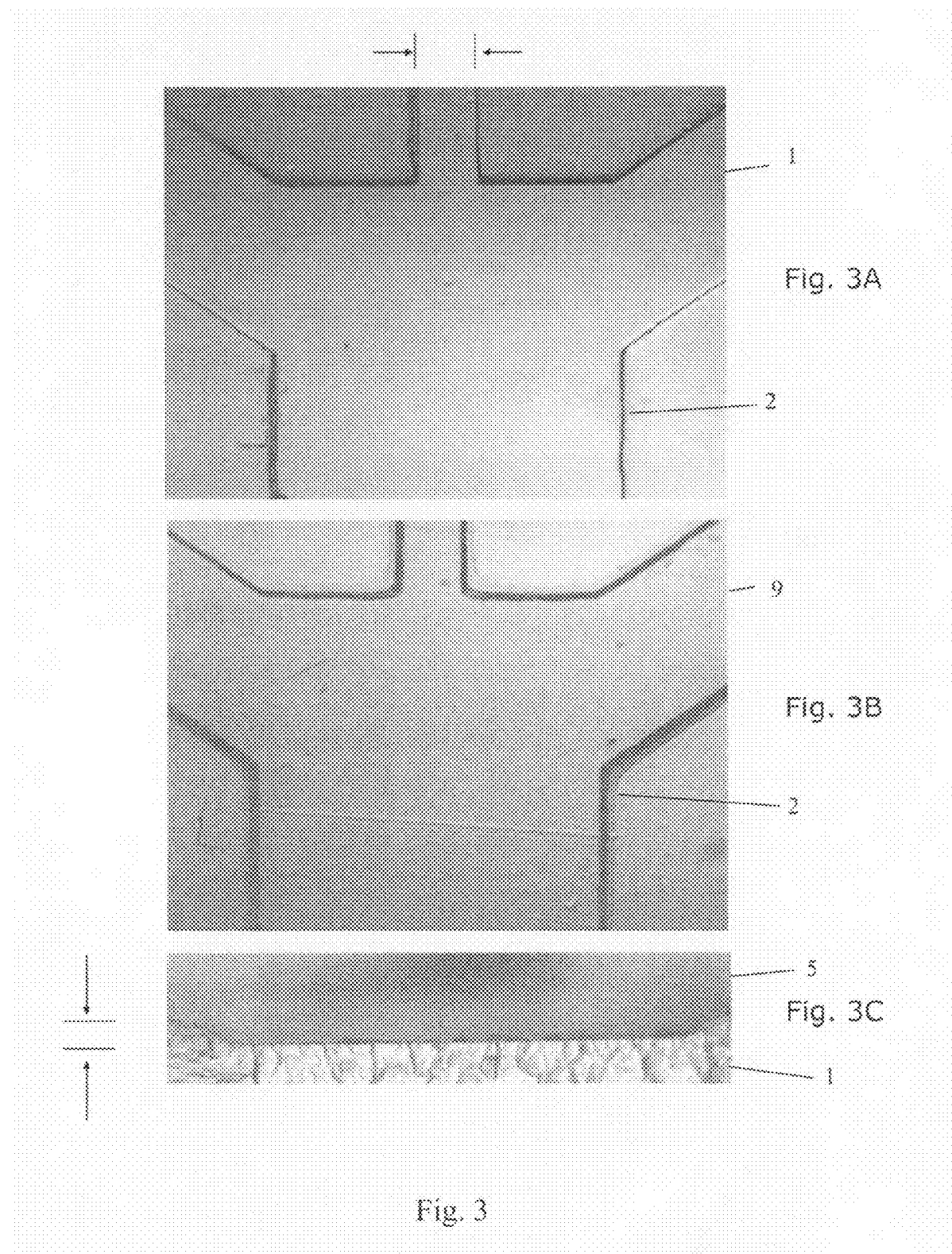
FIGS. 3A and 3B are top view reproduced images of microstructures in a substrate component of a microfluidic structure before and after, respectively, enclosing the microstructures according to an exemplary embodiment of the invention.
FIG. 3C is a cross-sectional view of reproduced images of the structure shown in FIG. 3B.

The acetonitrile-bonded, laminated microfluidic structure 9 set forth in FIG. 3 was analyzed topographically and in cross-section. The microstructures 2 of the structure 9 are microfluidic pathways of between about 200 to 1000 μm in width and 30 μm deep. The base plate 1 is a 1 mm thick polystyrene substrate in which the pathways are disposed. The cover plate 5 is a 1 mm thick polystyrene substrate. The microfluidic pathways 2 were enclosed by the process described above with reference to FIG. 2. FIGS. 3A and 3B are top view images before and after enclosing the microfluidic pathways 2 via lamination of the base plate 1 and the cover plate 5, respectively. FIG. 3C is a cross-sectional view of the enclosed pathway. Substantially no pathway deformation or other dimensional alternation is observed. The integrity of the surface of the structure and optical clarity of the substrate 9 are also retained as there is no observable cracking or other material damage.

A beneficial aspect of acetonitrile-bonded lamination is that the process according to an embodiment of the invention allows substrate alignment for structures containing multi-component layers or fluid networks constructed utilizing both the cover plate and the base plate. Unlike conventional strong solvent lamination, which tends to penetrate the polymeric substrate surface aggressively and create a tacky bonding surface within seconds of solvent application, acetonitrile at room temperature exhibits a very weak power to soften the substrate upon application. When the acetonitrile is present between the mated surfaces, at lower temperature prior to thermal activation, it functions similar to a lubricant and allows the adjacently contacted surfaces to slide freely against each other. Upon thermal activation of the acetonitrile and application of pressure, the mated surfaces form a substantially irreversible bond.

Figure 4:
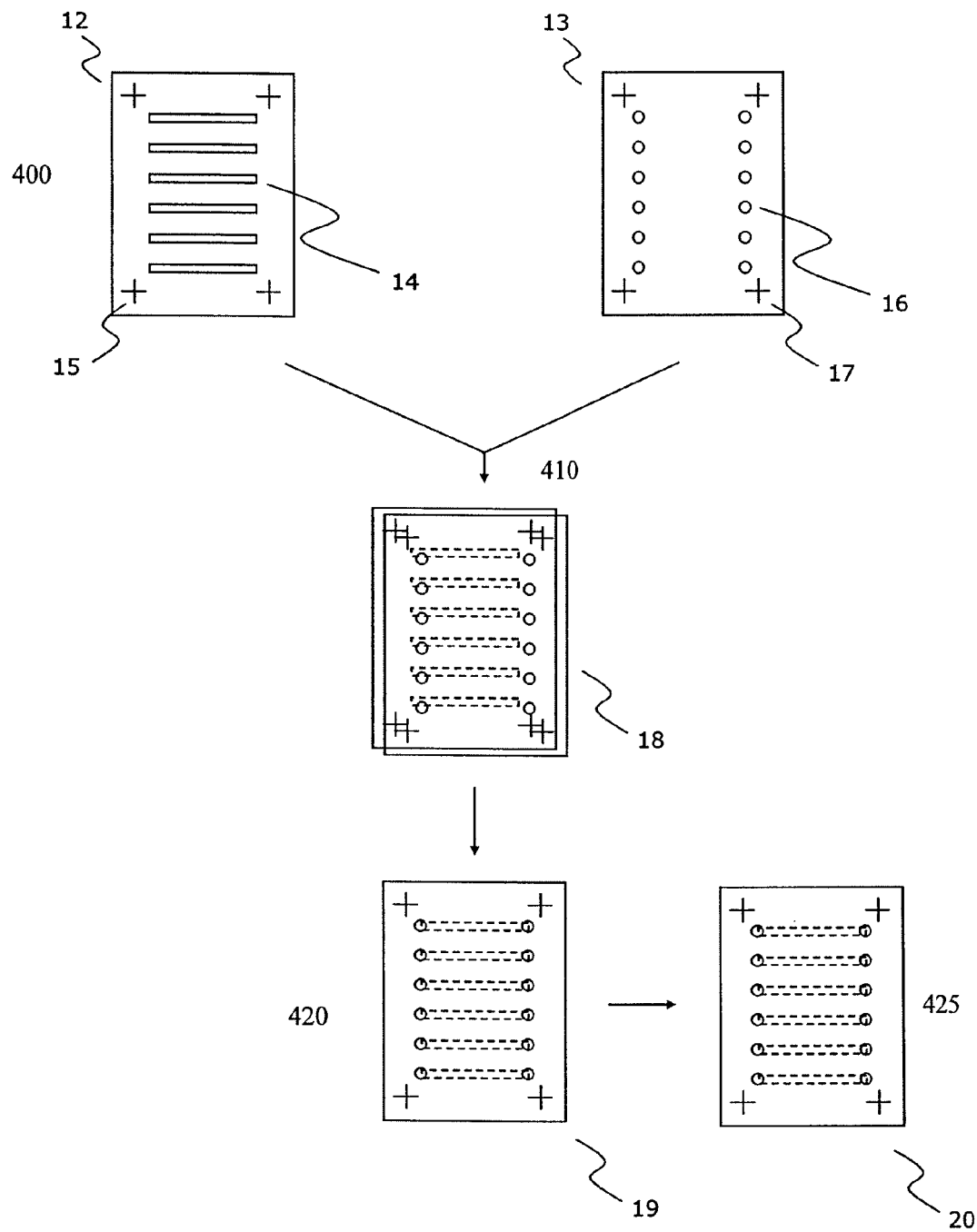
FIG. 4 is a diagrammatic illustration of a laminated microfluidic structure fabrication method including an alignment step according to an illustrative aspect of the invention.

The alignment aspect of the process is illustrated by example in FIG. 4. At step 400 polystyrene base plate 12 containing microstructures 14 and alignment keys 15 is wetted with acetonitrile at room temperature in a suitable manner, such as described above. A cover plate 13 of the same material, containing fluid loading ports 16 and alignment keys 17 is placed atop the base plate 12 in adjacent contact at step 410. The stacked assembly 18 is aligned at step 420 using the alignment keys 15 and 17 to give the aligned assembly 19. The aligned assembly 19 is then laminated at an elevated temperature and pressure for a short period, at 425, resulting in the finished, laminated microfluidic structure 20. Exemplary ranges of the temperature of the applied acetonitrile are between about minus 10 to positive 30° C., more particularly between about 0 to +24° C. The thermal activating temperature is above about +20° C. Exemplary amounts of pressure applied to the adjacently contacted components to assist the laminating process are up to about 10 psi, more particularly between 0 to 2.5 psi. Illustrative compression time of the lamination process is from seconds to minutes when a roll laminator or a heated platen press is used.

Formation of three-dimensional fluid networks is critical for developing microfluidic applications. Similar to the two-dimensional printed circuit board (PCB) case in which the "printed" wires cannot cross each other without electric connectivity, fluidic channels or pathways also cannot cross each other without fluidic connectivity. To build a simple crossover structure in a microfluidic chip, the fluid channels must be located in different layers at the crossover section and be joined by vertical fluid pathways to complete the fluid network.

Figure 5:
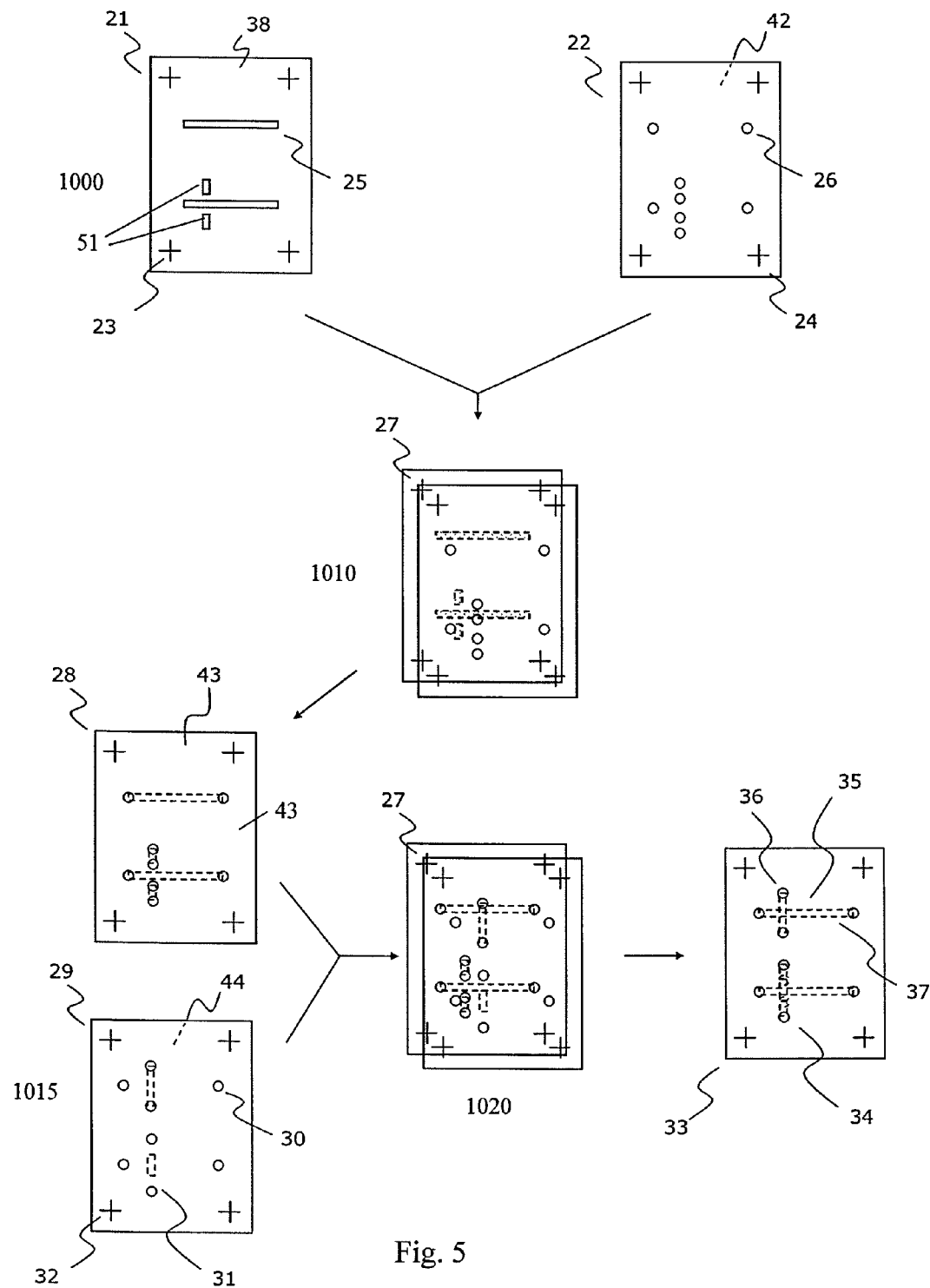
FIG. 5 is a diagrammatic illustration of a laminated microfluidic structure fabrication method for a topographically complex structure using repetitive solvent lamination according to an illustrative aspect of the invention.
Figure 6A:
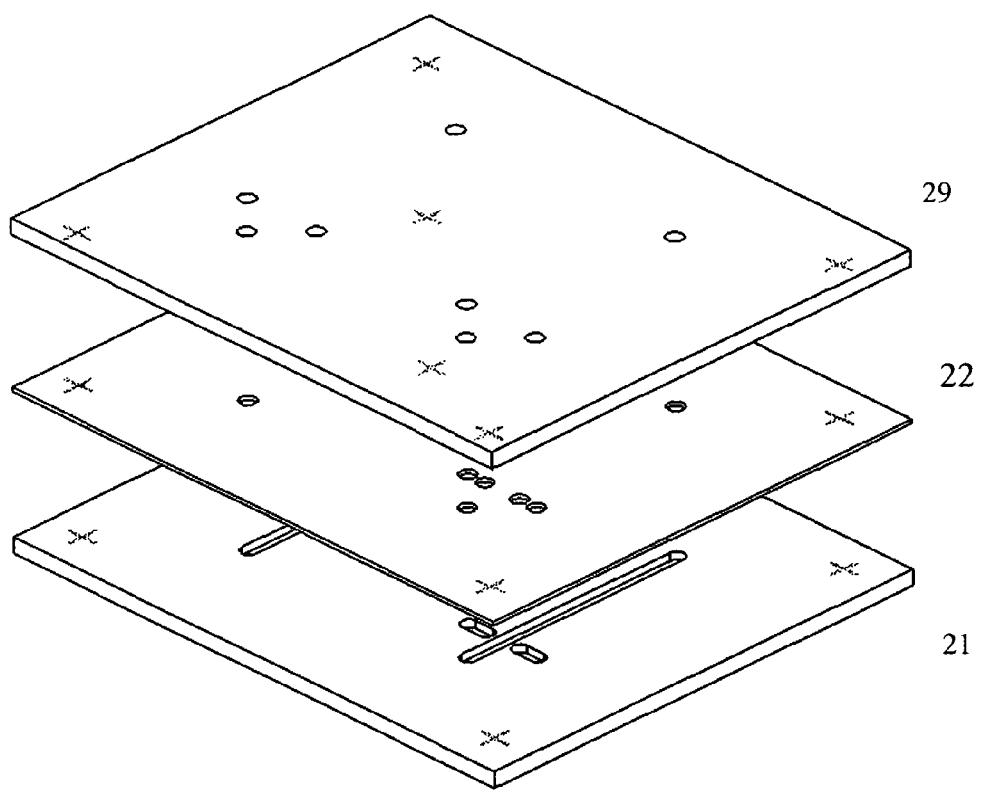
FIGS. 6A and 6B are an exploded assembly view and a schematic perspective view, respectively, of a laminated microfluidic structure according to an exemplary embodiment of the invention.
Figure 6B:
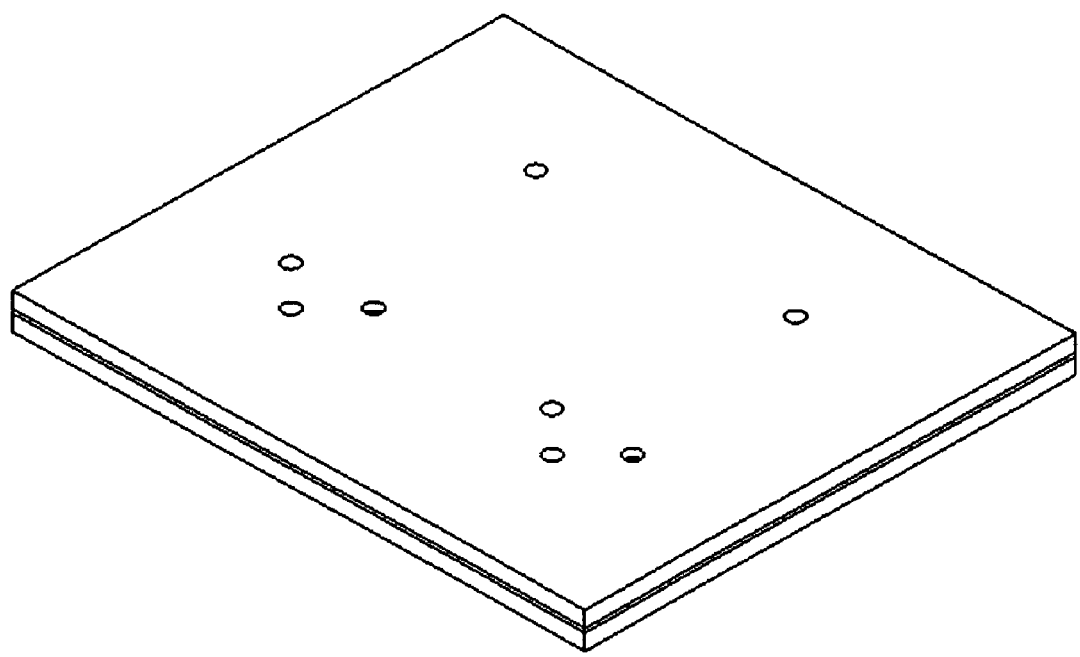

FIG. 5 illustrates an embodiment of the invention directed to the fabrication process for the formation of a three-dimensional fluid network microfluidic structure. The illustrated process utilizes a three-layer substrate, two-step weak solvent bonding lamination process. A first, polymeric base plate component 21 is provided that includes microstructures 25 and alignment keys 23, which are produced, for example, by direct machining, hot embossing or micromolding. A second, polymeric cover plate component 22 having fluid through-holes 26 and alignment keys 24 is also provided. At step 1000, an appropriate surface 38 of the first component 21 is wetted with weak solvent bonding agent acetonitrile at room temperature. The second component 22 is set atop the base plate 21 such that top surface 38 of component 21 and opposing bottom surface 42 of component 22 are in adjacent contact. The stacked components 21 and 22 are slidingly aligned aided by the alignment keys 23 and 24. The structure is then laminated/bonded at elevated temperature and pressure (in the ranges described herein above) at step 1010 to produce the lower level microfluidic assembly 28. A third, cover plate component 29, including a partial fluid network 31, through-holes 30 and alignment keys 32, is provided at step 1015. A top surface 43 of assembly 28 is wetted with weak solvent bonding agent acetonitrile at room temperature as described previously. The third component 29 is then set atop the assembly 28 such that top surface 43 of component 22 and opposing bottom surface 44 of component 29 are in adjacent contact. The stacked components 28 and 29 are slidingly aligned with the aid of alignment keys 24, 32. The structure is then laminated/bonded at elevated temperature and pressure (in the ranges described herein above) at step 1020 to produce the three-dimensional microfluidic structure 33, which includes two crossover microstructures 34 and 35. While both crossover microstructures 34, 35 deliver fluids across each other without fluidic connectivity, the fluidic patterns generated by these two crossover microstructures on the base plate 21 are distinctly different. The crossover microstructure 35 is formed by enclosing two straight channels 36 and 37, which are fabricated at different levels of the microfluidic structure 33. No common plane is shared by different channels or channel segments. The other crossover microstructure 34 is considerably more complicated. In addition to providing a non-conductive fluidic crossover pathway, crossover microstructure 34 also enables a segment of the upper fluid network 51 to coexist on the same plane 38 and leads to the formation of an isolated fluid segment 51 in two-dimensional space as shown in component 21. The utility of a discontinuous fluid segment in two-dimensional space is described in U.S. patent application Ser. No. 20030156992, entitled Microfluidlc system is including three-dimensionally arrayed channel networks, incorporated herein by reference in its entirety to the fullest allowable extent. FIGS. 6A and 6B illustrate exploded and assembled views, respectively, of the microfluidic structure resulting from the fabrication process described in association with FIG. 5.

In the case where the microstructure(s) in a component is small, e.g., having a depth on the order of about 5 μm or less, and the planar width of the pattern is large, e.g., 1 mm or more, and in addition the enclosing component is a thin film having a thickness of about 200 μm or less, the lamination force applied to the component pair may cause the upper component to impinge upon and bond to the lower component causing blockage of the pathway. One way to prevent this problem is to control the presence of bonding agent in the microstructure(s). If the applied bonding agent is not present in the pathway during thermal activation, the upper component will not bond to the pathway of the lower component. The upper component will lift back to its intended position when the assembly returns to room temperature.

There are a number of ways in which the acetonitrile bonding agent can be manipulated to allow lamination of two components without deforming the enclosed microstructure(s). When the base component containing the microstructure(s) is brought into contact with the cover component, the space between the two components may typically be on the order of about 50 to 100 nm, which is much less than the depth of the microstructures, i.e., about 1 μm or more. It is well known that the capillary force of a liquid is indirectly proportional to the width of the gap the liquid is filling. Thus there will be a higher capillary force in the area to be bonded than in the microstructure(s). This phenomena can be exploited to contain the weak solvent only to the areas of the structure intended for bonding. As previously mentioned, the two substrates can be sprayed with solvent and then contacted. The solvent will generally completely fill the void between the substrates, including the microstructures. The solvent can subsequently be suctioned from the microstructures leaving the solvent to remain only in the areas between the substrates that are intended for bonding to occur. Alternatively, if the opposing surfaces of the substrates are put in adjacent contacted prior to solvent exposure, the solvent can then be introduced to the exposed edge of the contacted components. The solvent will "wick" into the area where the components are in contact while the microstructures remain solvent-free.

As disclosed above, the acetonitrile bonding agent requires thermal activation in order to create a bond between the polymeric components. The requisite heating can be provided in a number of ways. When the heat is applied to the components by positioning them on a heat source, the heat must be conducted through the components to the bonding interface. This method, while simple, may not be amenable for applications where the substrate is bulky or there are fine structures sensitive to the solvent treatment under thermally activated conditions. Another exemplary method that provides the necessary energy at the bonding interface without significantly heating the substrate components is referred to herein as solvent-assisted microwave bonding. In this method the substrate components are prepared for bonding as previously disclosed. However, instead of conventional heating the bulk structure by contacting a high temperature source, the assembled component pair is exposed to microwave energy (a subset of the radio frequency (RF) spectrum). The microwave energy is predominately absorbed by the polar solvent molecules without affecting the bulk plastic component structure, thus heating the bonding interface without bulk heating of the substrates. This method is particularly useful in situations where the heating area needs to be surface restricted. Thus, more generally, RF energy could be applied at a frequency that will cause the necessary dipole movements in the solvent to generate heat, while not directly heating the plastic substrate. As a result, the solvent would heat and warm the interface to initiate a bond.

As stated, weak solvent bonding requires the application of energy to the bond interface between the two substrates to be bonded. The applied energy will heat the interface, either directly or indirectly, and assist the solvent swelling of the surfaces of the plastic substrates facilitating interface bonding.

In the simplest case, thermal energy is conducted through the substrate or substrates, raising the temperature of the interface and causing a bond. Given the thickness of the substrates (typically in excess of 1 mm) and the low thermal conductivity (0.12 W/m° C.), this heating process may take significant time, e.g., 20 seconds or more. In order to advantageously minimize the time required, higher temperatures (50-70° C.) can be applied to the exterior of the substrates to bring the interface to temperature more quickly. However, since the softening temperature of polystyrene is relatively low, this higher temperature can lead to unwanted creep rates and/or detrimentally affect other microfluidic component structures.

Ultrasonic energy is another exemplary form of energy that could be used to heat the bond interface without significantly heating the bulk substrate. Ultrasonic bonding in plastics works by vibrating the plastic substrates, typically in a direction normal to the plane of the substrate, at frequencies in the range of between about 15-40 KHz. This vibration leads to frictional heating of the interface between the substrates. Once the temperature of the interface exceeds the melting temperature of the plastic, a bond forms. Vendors such a Branson Ultrasonics Corporation sell equipment for industrial plastic bonding applications. According to an exemplary aspect, weak solvent-assisted ultrasonic bonding could be used to increase the temperature of the bond interface only to that required to activate the weak solvent present at the interface, instead of heating the interface to the melting point; for example, in the range between about 24-45° C.

The structure to be bonded or laminated by the weak solvent bonding agent may, alternatively, be cooled prior to weak solvent application.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description but rather by the claims appended hereto.

We claim:

1. A method for laminating at least two polymeric components to form a laminated, polymeric microfluidic structure, comprising:
    applying a weak solvent to a surface of one of the at least two components,
    wherein the weak solvent has a chemical formula of:

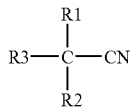

where,
    R1=H or R, where R=alkyl,
    R2=H or R, where R=alkyl, and
    R3=H or R, where R=alkyl;
        adjacently contacting opposing surfaces, including the surface having the applied weak solvent, of the at least two components; and
        creating a thermal activation condition for thermally activating the weak solvent, wherein the thermal activation condition includes at least one of applying radio frequency energy and ultrasonic energy.

2. The method of claim 1, further comprising applying pressure to the at least two components while thermally activating the applied weak solvent.

3. The method of claim 2, further comprising aligning the at least two components prior to thermally activating the applied weak solvent.

4. The method of claim 1, further comprising sliding the at least two components into a desired alignment after applying the weak solvent and adjacently contacting opposing surfaces of the at least two components.

5. The method of claim 1, comprising increasing the temperature of an interface containing the bonding agent to a temperature less than the melting temperature of the interface.

6. The method of claim 1, comprising increasing the temperature of the interface to between about 24 to 45 degrees Celsius.

7. A method for laminating at least two polymeric components to form a laminated, polymeric microfluidic structure, comprising:
    applying a weak solvent to a surface of one of the at least two components, wherein the weak solvent has a chemical formula of:

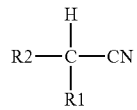

where,
    R1=H or R, where R=alkyl, and
    R2=H or R, where R=alkyl;
        adjacently contacting opposing surfaces, including the surface having the applied weak solvent, of the at least two components; and
        creating a thermal activation condition for thermally activating the weak solvent, wherein the thermal activation condition includes at least one of applying radio frequency energy and ultrasonic energy.

8. The method of claim 7, further comprising applying pressure to the at least two components while thermally activating the applied weak solvent.

9. The method of claim 8, further comprising aligning the at least two components prior to thermally activating the applied weak solvent.

10. The method of claim 7, further comprising sliding the at least two components into a desired alignment after applying the weak solvent and adjacently contacting opposing surfaces of the at least two components.

11. The method of claim 7, comprising increasing the temperature of an interface containing the bonding agent to a temperature less than the melting temperature of the interface.

12. The method of claim 7, comprising increasing the temperature of the interface to between about 24 to 45 degrees Celsius.

13. A method for laminating at least two polymeric components to form a laminated, polymeric microfluidic structure, comprising:
    applying a weak solvent to a surface of one of the at least two components, wherein the weak solvent has a chemical formula of:

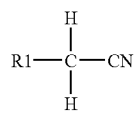

where,
    R1=H or R, where R=alkyl;
        adjacently contacting opposing surfaces, including the surface having the applied weak solvent, of the at least two components; and
        creating a thermal activation condition for thermally activating the weak solvent, wherein the thermal activation condition includes at least one of applying radio frequency energy and ultrasonic energy.

14. The method of claim 13, further comprising applying pressure to the at least two components while thermally activating the applied weak solvent.

15. The method of claim 14, further comprising aligning the at least two components prior to thermally activating the applied weak solvent.

16. The method of claim 13, further comprising sliding the at least two components into a desired alignment after applying the weak solvent and adjacently contacting opposing surfaces of the at least two components.

17. The method of claim 13, comprising increasing the temperature of an interface containing the bonding agent to a temperature less than the melting temperature of the interface.

18. The method of claim 13, comprising increasing the temperature of the interface to between about 24 to 45 degrees Celsius.

19. A method for laminating at least two polymeric components to form a laminated, polymeric microfluidic structure, comprising:
   applying a weak solvent to a surface of one of the at least two components, wherein the weak solvent is acetonitrile;
   adjacently contacting opposing surfaces, including the surface having the applied weak solvent, of the at least two components; and
   creating a thermal activation condition for thermally activating the weak solvent, wherein the thermal activation condition includes at least one of applying radio frequency energy and ultrasonic energy.

20. The method of claim 19, further comprising applying pressure to the at least two components while thermally activating the applied weak solvent.

21. The method of claim 20, further comprising aligning the at least two components prior to thermally activating the applied weak solvent.

22. The method of claim 19, further comprising sliding the at least two components into a desired alignment after applying the weak solvent and adjacently contacting opposing surfaces of the at least two components.

23. The method of claim 19, comprising increasing the temperature of an interface containing the bonding agent to a temperature less than the melting temperature of the interface.

24. The method of claim 19, comprising increasing the temperature of the interface to between about 24 to 45 degrees Celsius.

* * * * *